(12) United States Patent
Lin et al.

(10) Patent No.: US 6,493,276 B2
(45) Date of Patent: *Dec. 10, 2002

(54) WORD LINE BOOST CIRCUIT

(75) Inventors: Yu Shen Lin, Taipei; Chun-Hsiung Hung, Hsinchu, both of (TW); Ray-Lin Wan, Fremont, CA (US)

(73) Assignee: Macronix International Co., Ltd., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 100 days.

(21) Appl. No.: 09/355,653
(22) PCT Filed: Feb. 2, 1999
(86) PCT No.: PCT/US99/02260
§ 371 (c)(1),
(2), (4) Date: Aug. 2, 1999
(87) PCT Pub. No.: WO00/46807
PCT Pub. Date: Aug. 10, 2000

(65) Prior Publication Data
US 2001/0046161 A1 Nov. 29, 2001

(51) Int. Cl.$^7$ ................................................ G11C 7/00
(52) U.S. Cl. .............................. 365/189.11; 365/230.06; 327/390
(58) Field of Search ........................... 365/189.11, 203, 365/230.06, 189.01, 230.01; 327/390, 589

(56) References Cited

U.S. PATENT DOCUMENTS

| 4,769,792 A | * | 9/1988 | Nogami et al. ............. 365/222 |
| 5,612,924 A | * | 3/1997 | Miyamoto ............... 365/233.5 |
| 5,701,096 A | * | 12/1997 | Higashiho ................... 327/536 |
| 5,708,387 A | | 1/1998 | Cleveland et al. .......... 327/536 |

* cited by examiner

Primary Examiner—Hoai V. Ho
(74) Attorney, Agent, or Firm—Mark A. Haynes; Haynes Beffel & Wolfeld LLP

(57) ABSTRACT

An improved word line boost circuit suitable for use on integrated circuits such as flash memory devices includes a two step boosting circuit with a floating circuit node. A first circuit provides an initial boost of the output voltage from a precharged voltage. Part of the first circuit is floated, lessening a load on a second circuit. Then, the second circuit provides a second boost of the output voltage with increased power efficiency. A time delay separates the onset of the second boosting operation from the onset of the first boosting operation so as to define a two-step boost.

25 Claims, 11 Drawing Sheets

US 6,493,276 B2

WORD LINE BOOST CIRCUIT

BACKGROUND OF THE INVENTION

1. Field of the Invention

This invention relates to the field of voltage boost circuits. In particular, the invention relates to integrated circuits using word line boost circuits to produce on-chip voltages outside the range of the off-chip voltage supply.

2. Description of the Related Art

The electronics industry has continued to define standard power supply voltages of decreasing magnitudes. Decreasing power supply voltages, such as 5 volts, 3 volts, and 1.8 volts, raise the demands on modern circuits to provide sufficiently high on-chip voltages despite a lower off-chip supply voltage. Flash memory is an example of an application that would welcome more efficient boosting of a low off-chip supply voltage to an on-chip voltage sufficiently high to access flash memory cells. Therefore, what is needed is a word line boost circuit having higher boosting efficiency.

SUMMARY OF THE INVENTION

An improved word line boost circuit is disclosed that increases boosting efficiency. The improved word line boost circuit can be implemented in an integrated circuit that includes a memory array with word lines powered by word line drivers. Boosting efficiency is increased by floating a part of a first circuit that initially boosts an output voltage of the word line boost circuit. Floating part of the first circuit obviates the need for a diode to isolate the first circuit, and decreases the load on a second circuit that further boosts the output voltage of the word line boost circuit, thereby increasing efficiency.

A boost circuit includes an output, a precharge circuit connected to the output, a first capacitor with a first terminal connected to the output, a first circuit connected to a second terminal of the first capacitor, a second capacitor, and a second circuit connected to the output through the second capacitor. The second terminal of the first capacitor can be in a floating state, set to a first supply voltage, or a second supply voltage. An onset of a first boost operation performed by the first circuit is followed after a time delay by an onset of a second boost operation performed by the second circuit.

In some embodiments, one of the first supply voltage and the second supply voltage is a ground; the precharge circuit has a switching circuit connected to the output of the first voltage supply and the second voltage supply; and the second terminal of the first capacitor switches between i) a floating state, ii) being set to a first supply voltage, and iii) being set to a second supply voltage in response to one or both of a first signal and a second signal.

In a further embodiment, the word line boost circuit is part of an integrated circuit device with a substrate. In yet another embodiment, the word line boost circuit is part of an integrated circuit memory device with a substrate, a memory array, and word lines.

A method for reducing energy consumption of a boost circuit to achieve higher boosting efficiency for the above mentioned word line boost circuit comprises: precharging an output to a precharge voltage, changing the output to a first voltage with a first coupling circuit that is connected to the output, floating a part of the first coupling circuit, and changing the output to a second voltage with a second coupling circuit connected to the output.

In some embodiments, the method for reducing energy consumption of a boost circuit to achieve higher boosting efficiency for the above mentioned word line boost circuit comprises: changing an output from a precharge voltage to a first voltage with a first circuit, setting a node in the first circuit to a floating voltage, and changing the output from the first voltage to a second voltage with an energy expenditure that is lower than if the node were not floating.

DETAILED DESCRIPTION

Figure 1:
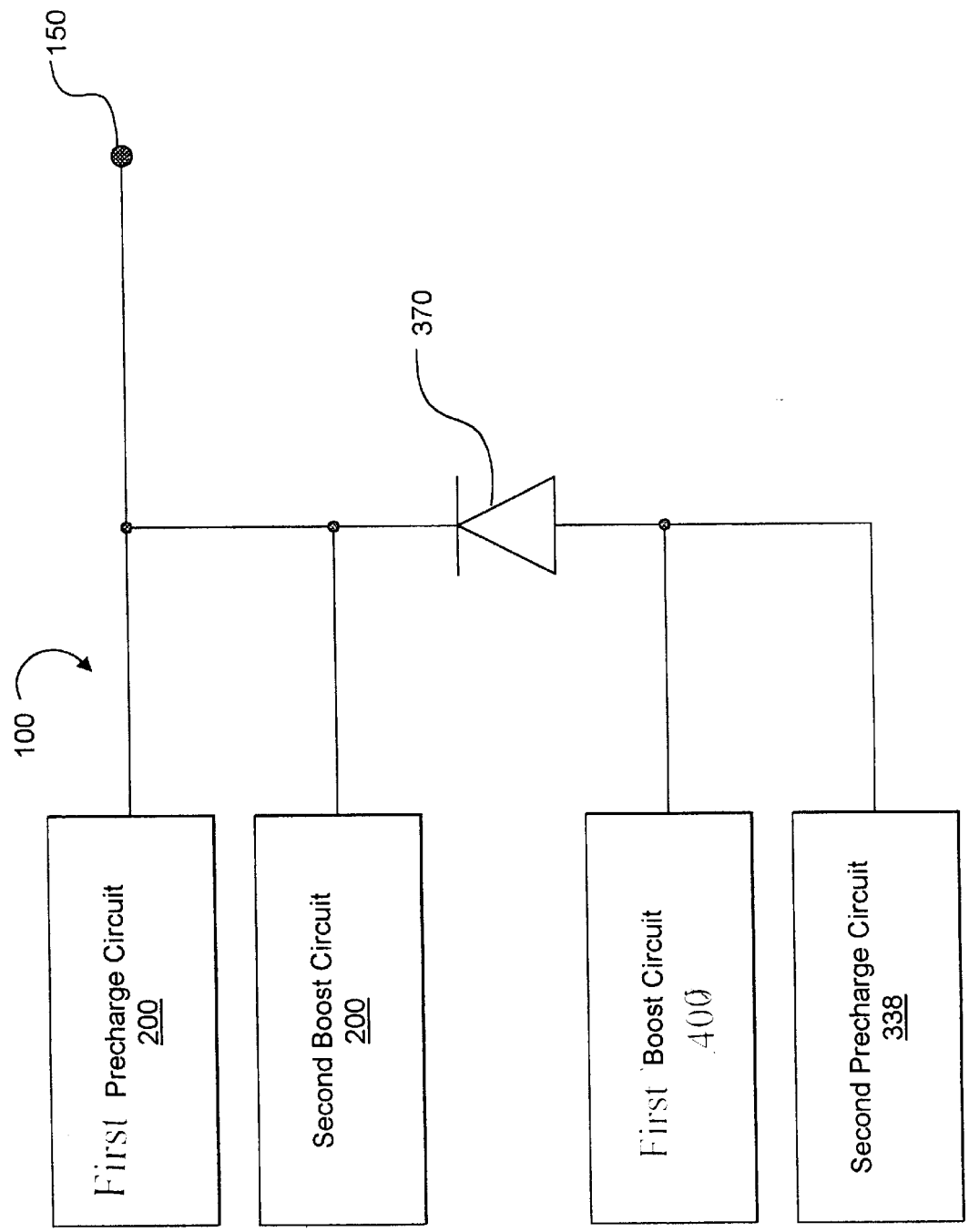
FIG. 1 is a block diagram of word line boost circuit representing an embodiment of the invention.

FIG. 1 illustrates a word line boost circuit 100. The word line boost circuit 100 includes a first precharge circuit 200, a first boost circuit 300, a second precharge circuit 338, a diode 370, a second boost circuit 400, and an output 150. The first precharge circuit 200 and the second precharge circuit 338 each serves as a node charging circuit that charges a node from a starting voltage to another voltage.

Figure 2:
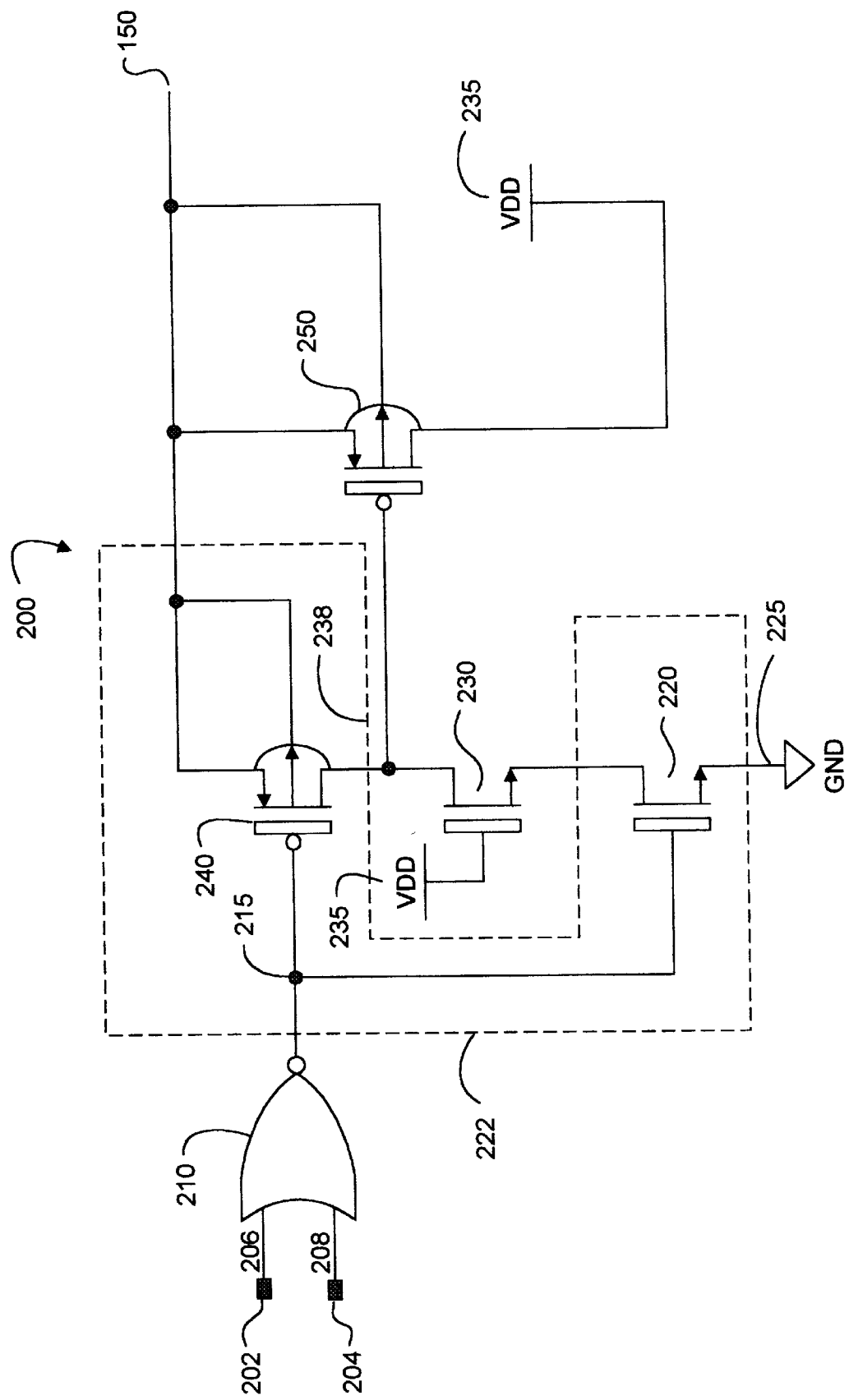
FIG. 2 is a circuit diagram of a precharge circuit.

FIG. 2 schematically illustrates the first precharge circuit 200. The first precharge circuit 200 includes a NOR gate 210, a first transistor 220, a second transistor 230, a third transistor 240, and a switching transistor 250. Switch circuit 222 includes the first transistor 220 and the third transistor 240. The NOR gate 210 has a first input terminal 202 receiving a first signal 206, a second input terminal 204 receiving a second signal 208, and an output connected to a node 215. The first transistor 220 is an n-channel transistor with a gate connected to the node 215, a source connected to a ground 225, and a drain. The second transistor 230 is an n-channel transistor with a gate connected to a voltage supply 235, a source connected to the drain of the first transistor 220, and a drain connected to a node 238. Node 238 is the output node of the switch circuit 222. The third transistor 240 is a p-channel transistor with a gate connected to the node 215, a source connected to the output 150, and a drain connected to the node 238. The switching transistor 250 is a p-channel transistor with a gate connected to the node 238, a source connected to the output 150, and a drain connected to the voltage supply 235. The first precharge circuit 200 charges the output 150 to the voltage of the voltage supply 235. The first precharge circuit 200 then floats the output 150.

Figure 3:
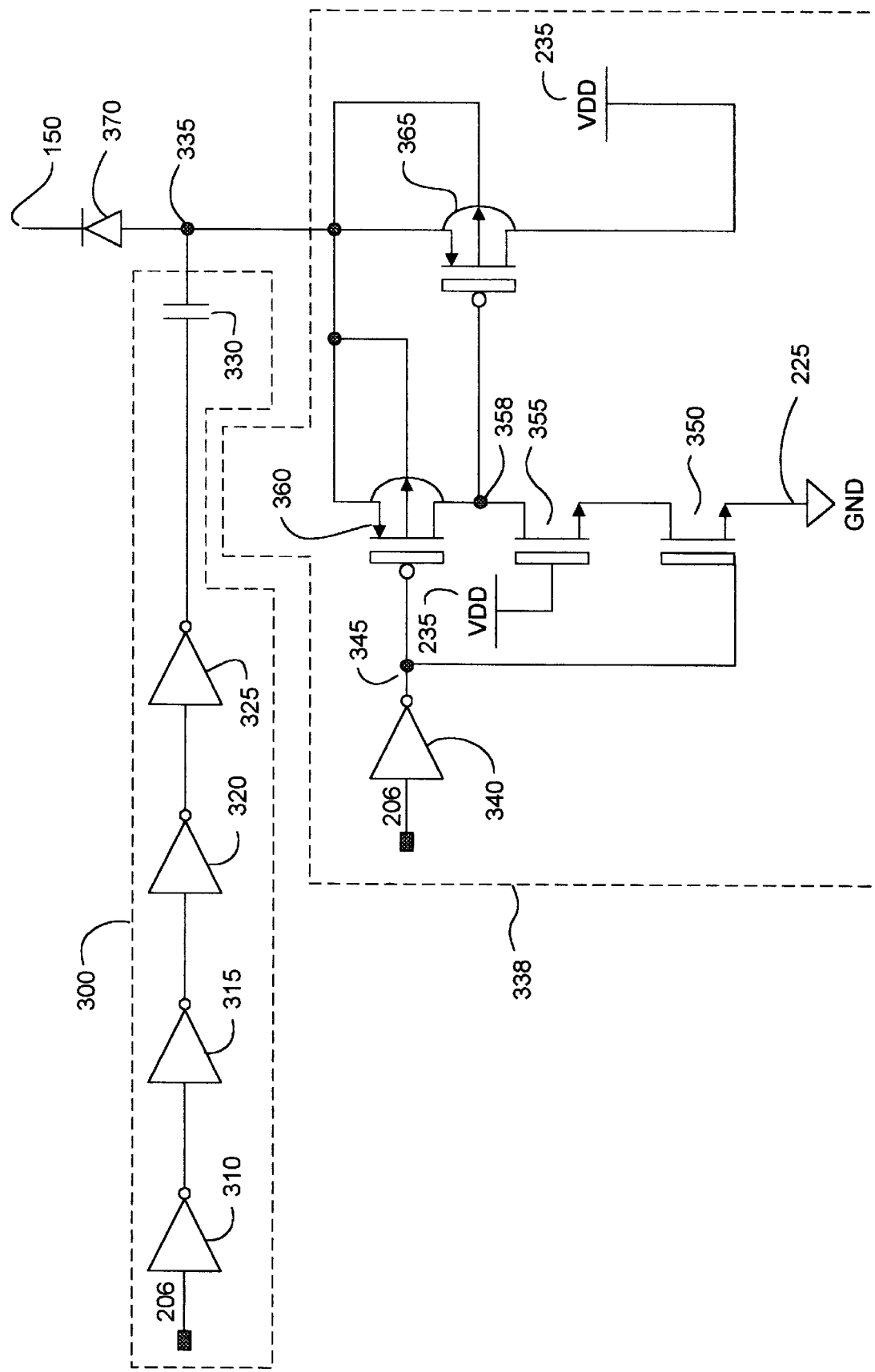
FIG. 3 is a circuit diagram of a first boost circuit.

FIG. 3 schematically illustrates the first boost circuit 300, the diode 370, and the second precharge circuit 338. The first boost circuit 300 includes a first inverter 310, a second inverter 315, a third inverter 320, a fourth inverter 325, and a first capacitor 330. The second precharge circuit 338 includes a fifth inverter 340, a fourth transistor 350, a fifth transistor 355, a sixth transistor 360, and a seventh transistor 365. The second precharge circuit 338 charges a node 335 to the voltage of the voltage supply 235. The second precharge circuit 338 then floats the node 335.

An input of the first inverter 310 receives the first signal 206. The first inverter 310, the second inverter 315, the third inverter 320, and the fourth inverter 325 are connected in series. The first capacitor 330 has a first terminal connected to an output of the fourth inverter 325, and a second terminal connected to the node 335. The fifth inverter 340 has an input that receives the first signal 206, and an output that is connected to a node 345. The fourth transistor 350 is an n-channel transistor with a gate connected to the node 345, a source connected to the ground 225, and a drain. The fifth transistor 355 is an n-channel transistor with a gate connected to the voltage supply 235, a source connected to the drain of the fourth transistor 350, and a drain connected to a node 358. The sixth transistor 360 is a p-channel transistor with a gate connected to the node 345, a source connected to the node 335, and a drain connected to the node 358. The seventh transistor 365 is a p-channel transistor with a gate connected to the node 358, a source connected to the node 335, and a drain connected to the voltage supply 235. The diode 370 has a first terminal connected to the node 335 and a second terminal connected to the output 150.

Figure 4:
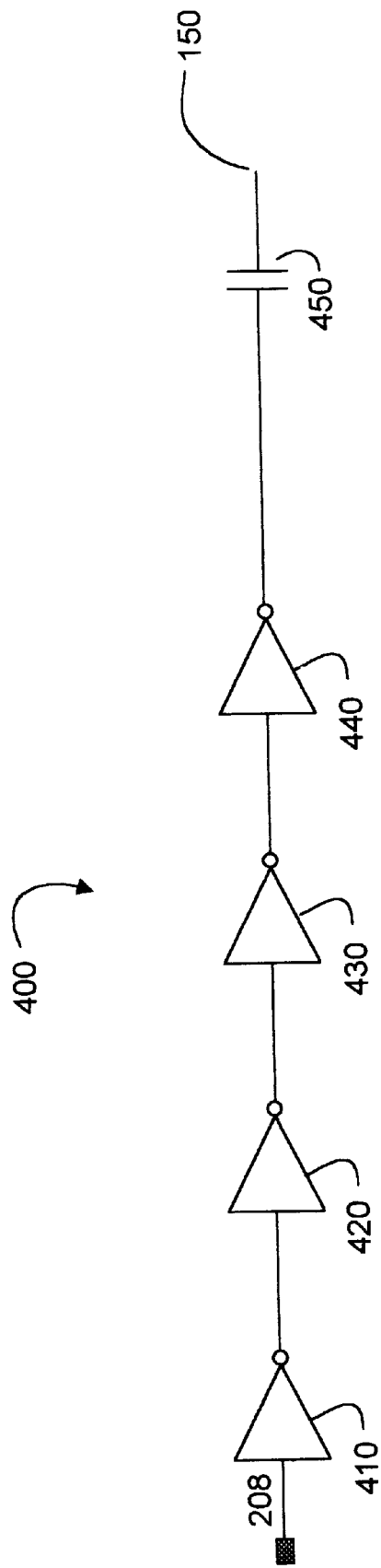
FIG. 4 is a circuit diagram of a second boost circuit.

FIG. 4 schematically illustrates the second boost circuit 400. The second boost circuit 400 includes a sixth inverter 410, a seventh inverter 420, an eighth inverter 430, a ninth inverter 440, and a second capacitor 450. An input of the sixth inverter 410 receives the second signal 208. The sixth inverter 410, the seventh inverter 420, the eighth inverter 430, and the ninth inverter 440 are connected in series. The second capacitor 450 has a first terminal connected to an output of the ninth inverter 440 and a second terminal connected to the output 150.

When the word line boost circuit 100 operates, the first precharge circuit 200 and the second precharge circuit 338 precharge both terminals of the diode 370. The first precharge circuit 200 and the second precharge circuit 338 float both terminals of the diode 370. The first boost circuit 300 boosts the first terminal of the diode 370. The second boost circuit 400 boosts the second terminal of the diode 370, or the output 150.

Figure 5:
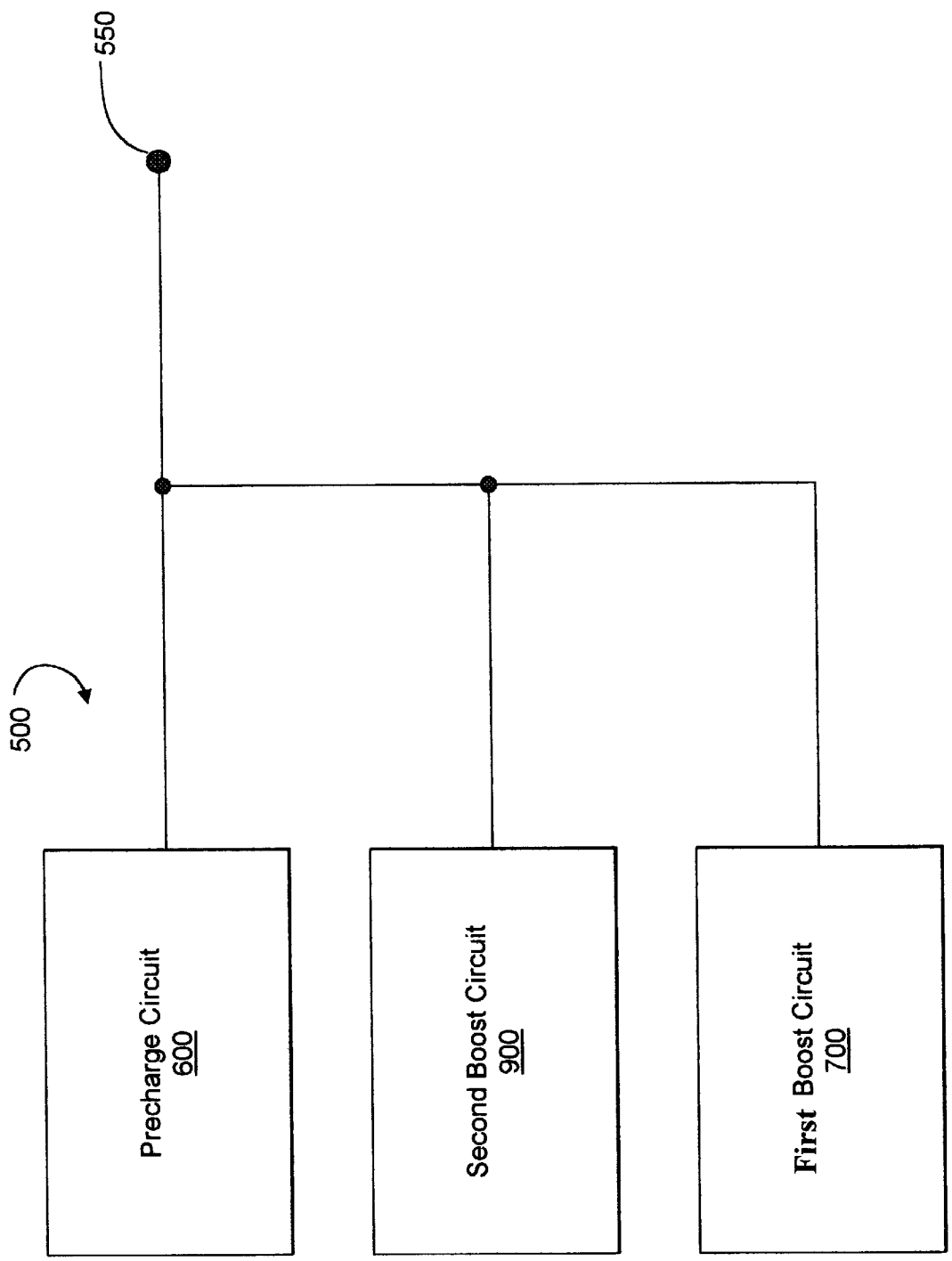
FIG. 5 is a block diagram of a word line boost circuit representing an embodiment of the invention.

FIG. 5 illustrates a word line boost circuit 500. The word line boost circuit 500 includes a precharge circuit 600, a first boost circuit 700, a second boost circuit 900, and an output 550.

Figure 6:
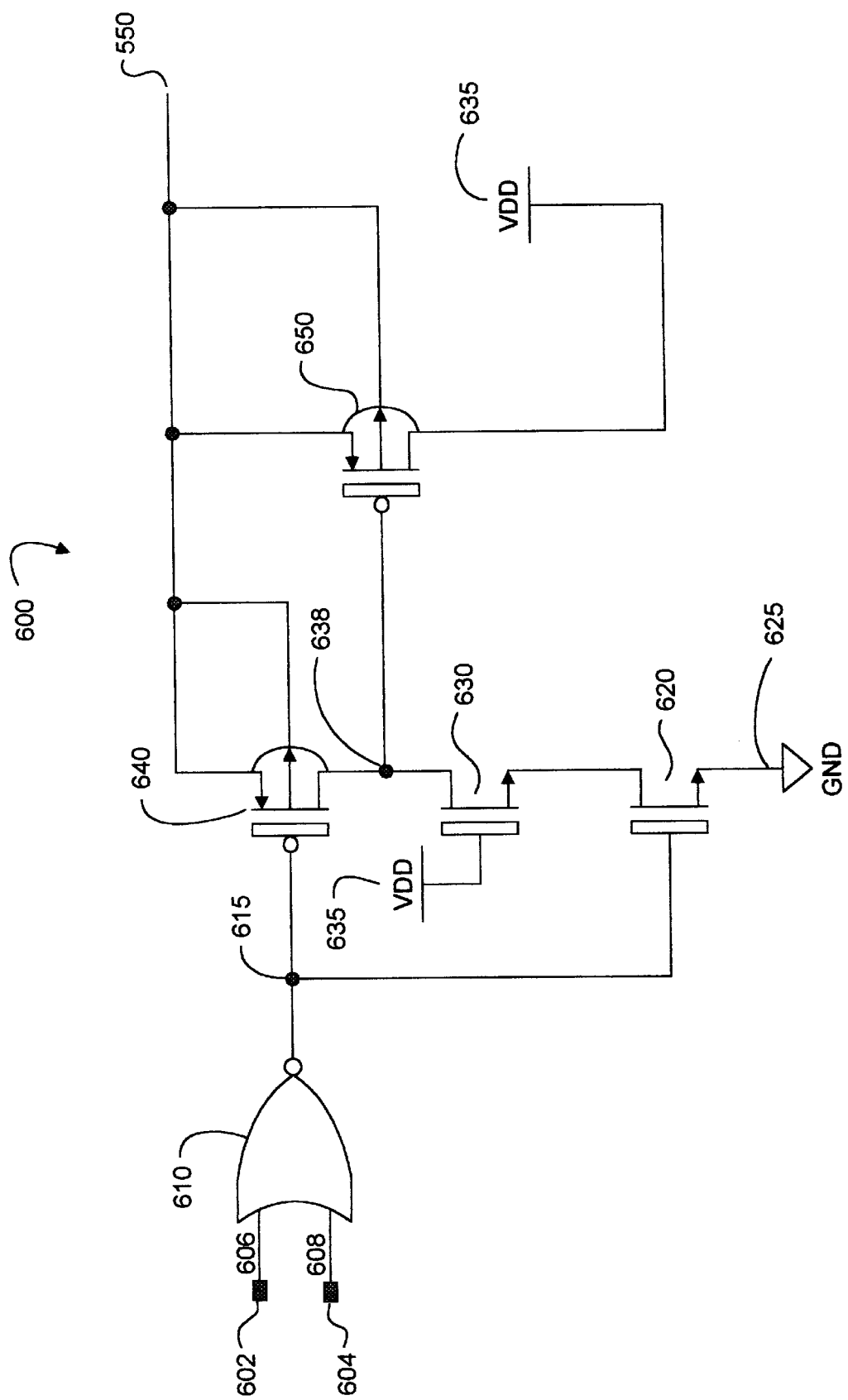
FIG. 6 is a circuit diagram of a precharge circuit.

FIG. 6 schematically illustrates the precharge circuit 600. Transistors having a thick gate oxide are indicated with a rectangle for a gate. The oxide thicknesses for thick gate oxide devices and thin gate oxide devices are 180 Å and 100 Å respectively for 0.4 micron technology. The precharge circuit 600 includes a first NOR gate 610, a first transistor 620, a second transistor 630, a third transistor 640, and a switching transistor 650. The first NOR gate 610 has a first input terminal 602 receiving a first signal 606, a second input terminal 604 receiving a second signal 608, and an output connected to a node 615. The first transistor 620 is an n-channel transistor with a thick gate oxide having a gate connected to the node 615, a source connected to a ground 625, and a drain. The second transistor 630 is an n-channel transistor with a thick gate oxide having a gate connected to a voltage supply 635, a source connected to the drain of the first transistor 620, and a drain connected to a node 638. The third transistor 640 is a p-channel transistor with a thick gate oxide having a gate connected to the node 615, a source connected to the output 550, and a drain connected to the node 638. The switching transistor 650 is a p-channel transistor with a thick gate oxide having a gate connected to the node 638, a source connected to the output 550, and a drain connected to the voltage supply 635.

Figure 7:
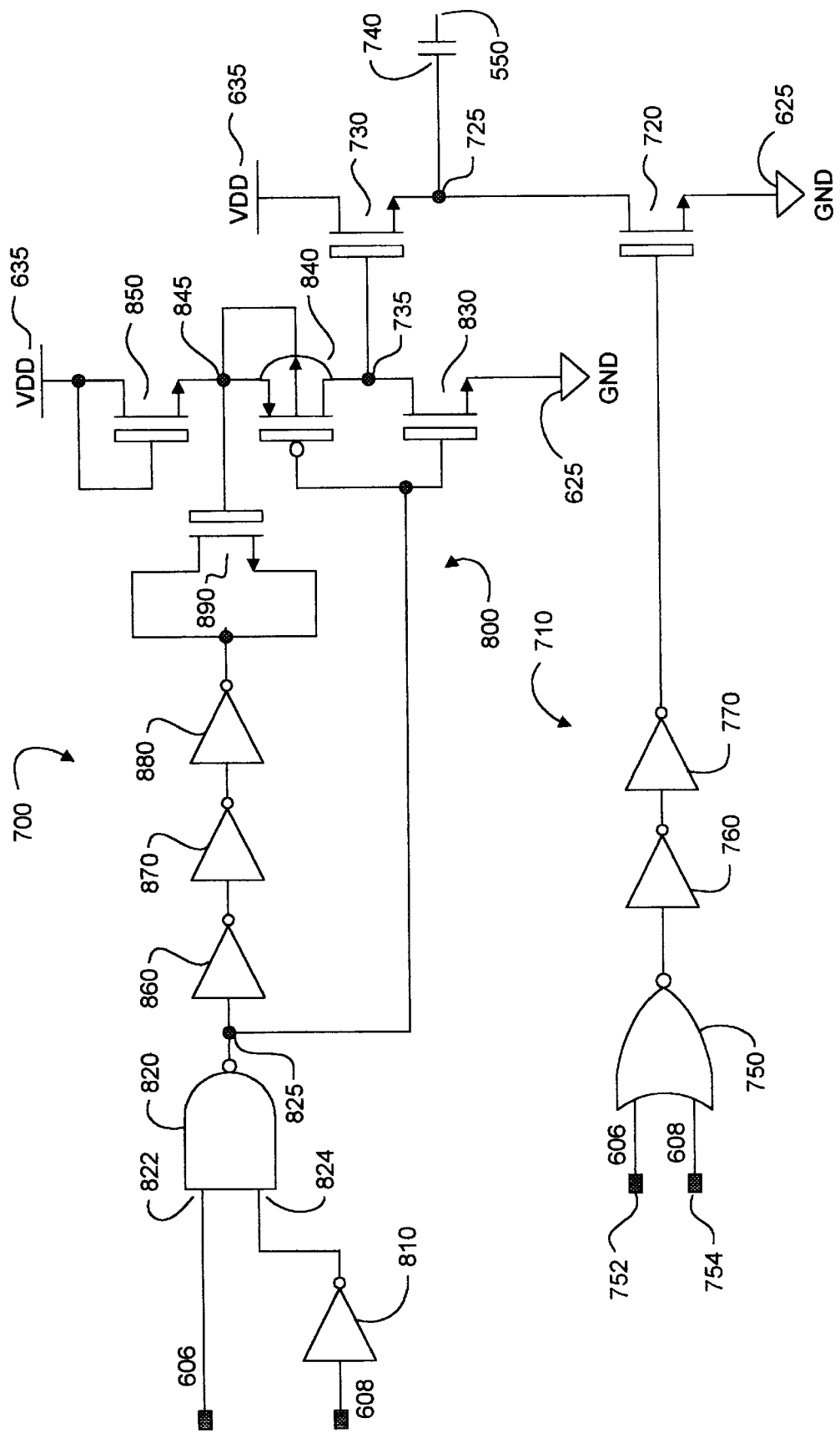
FIG. 7 is a circuit diagram of a first boost circuit.

FIG. 7 schematically illustrates the first boost circuit 700. Transistors having a thick gate oxide are indicated with a rectangle for a gate. The first boost circuit 700 includes a first branch 710, a fourth transistor 720, a fifth transistor 730, a first capacitor 740, and a second branch 800. The first branch 710 includes a second NOR gate 750, a first inverter 760, and a second inverter 770. The second branch 800 includes a third inverter 810, a first NAND gate 820, a sixth transistor 830, a seventh transistor 840, an eighth transistor 850, a fourth inverter 860, a fifth inverter 870, a sixth inverter 880, and a ninth transistor 890.

The second NOR gate 750 has a first input terminal 752 receiving the first signal 606 and a second input terminal 754 receiving the second signal 608. An output of the second NOR gate 750 is connected to an input of the first inverter 760. An output of the first inverter 760 is connected to an input of the second inverter 770. The fourth transistor 720 is an n-channel transistor with a thick gate oxide having a gate connected to an output of the second inverter 770, a source connected to the ground 625, and a drain connected to a node 725. The fifth transistor 730 is an n-channel transistor with a thick gate oxide having a gate connected to a node 735, a source connected to the node 725, and a drain connected to the voltage supply 635. The first capacitor 740 has a first terminal connected to the node 725 and a second terminal connected to the output 550. The third inverter 810 has an input receiving the second signal 608. The NAND gate 820 has a first input terminal 822 receiving the first signal 606, a second input terminal 824 connected to an output of the third inverter 810, and an output connected to a node 825. The sixth transistor 830 is an n-channel transistor 830 with a thick gate oxide having a gate connected to the node 825, a source connected to the ground 625, and a drain connected to the node 735. The seventh transistor 840 is a p-channel transistor with a thick gate oxide having a gate connected to the node 825, a drain connected to the node 735, and a source connected to a node 845. The eighth transistor 850 is a diode-connected n-channel transistor with a thick gate oxide having an anode connected to the voltage supply 635 and a cathode connected to the node 845. The fourth inverter 860 has an input connected to the node 825. The fifth inverter 870 has an input connected to an output of the fourth inverter 860. The sixth inverter 880 has an input connected to an output of the fifth inverter 870. The ninth transistor 890 is a capacitor-connected n-channel transistor with a thick gate oxide having a first terminal connected to an output of the sixth inverter 880 and a second terminal connected to the node 845.

Figure 8:
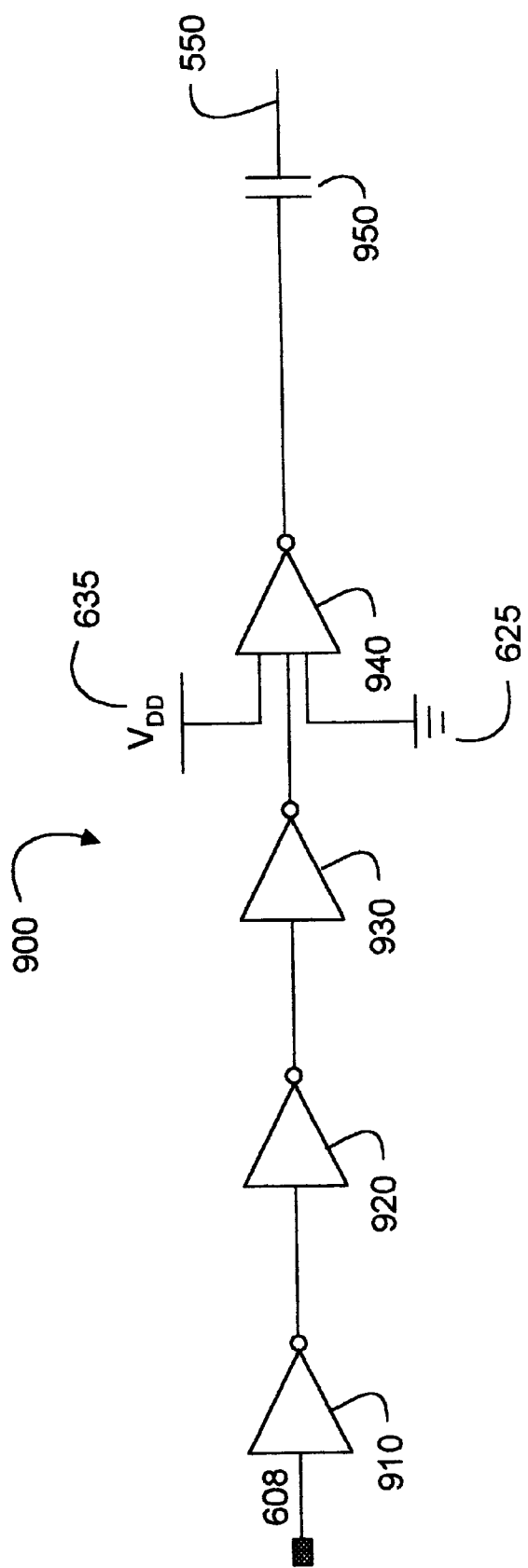
FIG. 8 is a circuit diagram of a second boost circuit.

FIG. 8 schematically illustrates the second boost circuit 900. The second boost circuit 900 includes a seventh inverter 910, an eighth inverter 920, a ninth inverter 930, a tenth inverter 940, and a second capacitor 950. An input of the seventh inverter 910 receives the second signal 608. The seventh inverter 910, the eighth inverter 920, the ninth inverter 930, and the tenth inverter 940 are connected in series. The second capacitor 950 has a first terminal connected to an output of the tenth inverter 940 and a second terminal connected to the output 550.

Figure 9:
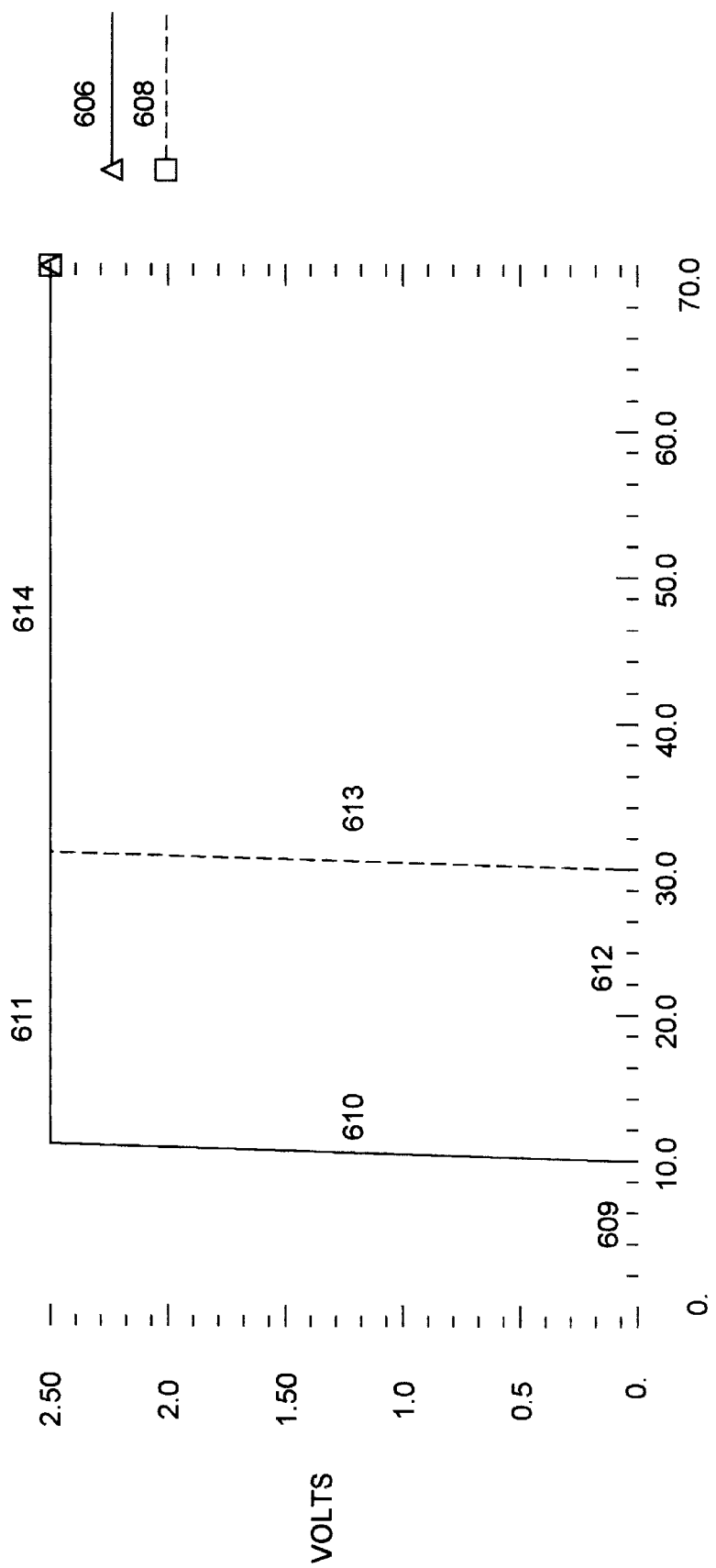
FIG. 9 is a timing diagram of a first signal and a second signal supplied to a word line boost circuit.

FIG. 9 is a timing diagram displaying voltage versus time for the first signal 606 and the second signal 608. The first signal 606 has a low level 609, a rising edge 610 triggering an onset of a first boost operation, and a high level 611. The second signal 608 has a low level 612, a rising edge 613 triggering an onset of a second boost operation, and a high level 614.

Figure 10:
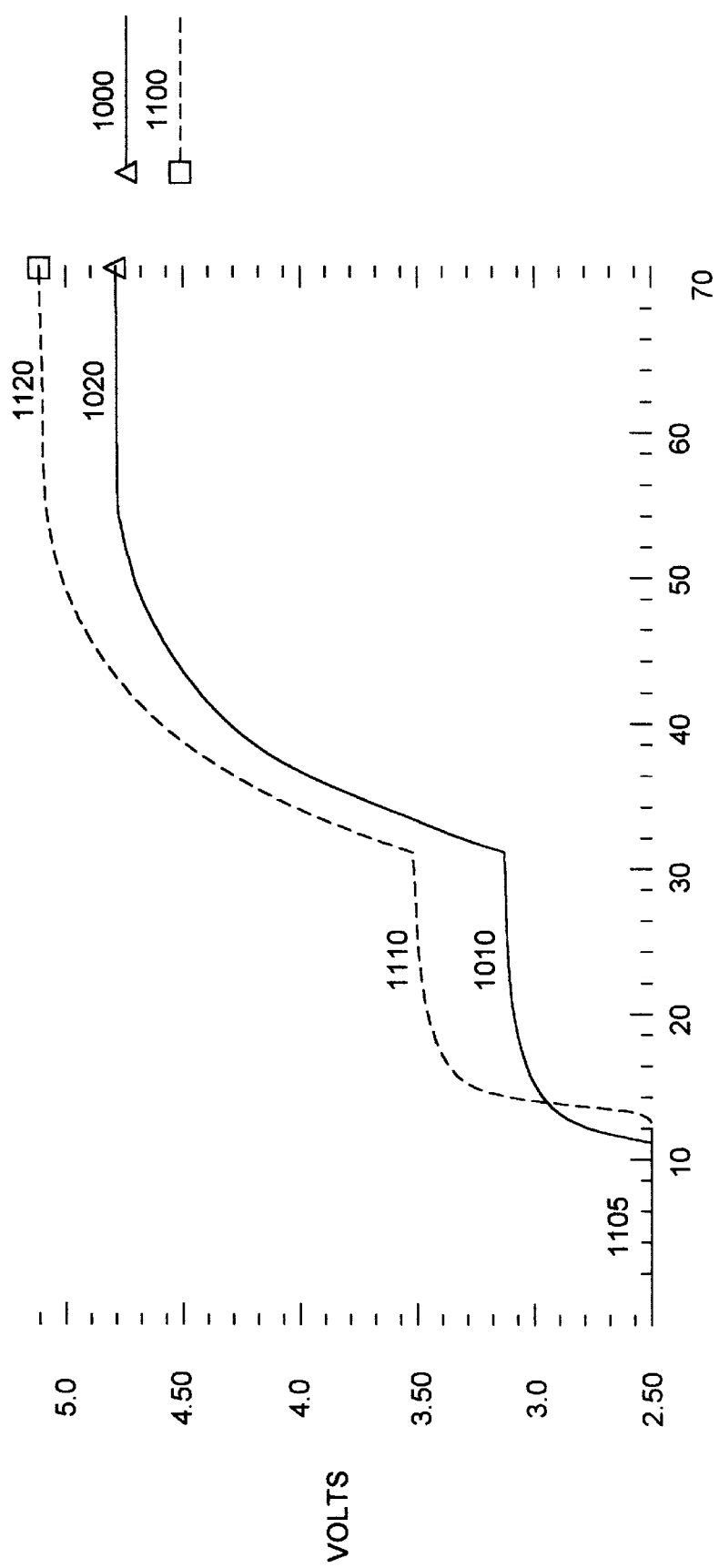
FIG. 10 is a timing diagram of voltages supplied by word line boost circuits representing embodiments of the invention.

FIG. 10 is a timing diagram displaying voltage versus time for an output signal 1000 supplied by the output, 150 and an improved output signal 1100 supplied by the output 550. Output signal 1000 has a first level 1010 and a second level 1020. Improved output signal 1100 has a precharge level 1105, a first level 1110, and a second level 1120.

With reference to FIG. 6–10, initially, the first signal 606 is at the low level 609 and the second signal 608 is at the low level 612. The precharge circuit 600 connects the output 550 to voltage supply 635 through the switching transistor 650. The improved output signal 1 00 has the precharge level 1105 of 2.5 volts. The first branch 710 of the first boost circuit 700 turns on the fourth transistor 720 and the second branch 800 turns off the fifth transistor 730. The first terminal of the first capacitor 740 is connected to the ground 625 through the fourth transistor 720. The second boost circuit 900 connects the first terminal of the second capacitor 950 to the ground 625 through the tenth inverter 940.

The rising edge 610 of the first signal 606 triggers the onset of the first boost operation. In the precharge circuit 600, the switching transistor 650 turns off. The output 550 is no longer connected to the voltage supply 635. The first branch 710 of the first boost circuit 700 turns off the fourth transistor 720. The second branch 800 turns on the fifth transistor 730, connecting the voltage supply 635 to the first terminal of the first capacitor 740. Capacitive coupling through the first capacitor 740 raises the improved output signal 1100 to the first level 1110, yielding advantageous results. Specifically, the first level 1110 of the improved output signal 1100 is about 3.5 volts, about 0.3 volts higher than the first level 1010 of the output signal 1000. This difference is both of significant magnitude and sustained duration.

The rising edge 613 of the second signal 608 triggers the onset of the second boost operation. The second branch 800 turns off the fifth transistor 730. The first terminal of the first capacitor 740 floats. The second boost circuit 900 connects the first terminal of the second capacitor 950 to the voltage supply 635 through the tenth inverter 940. Capacitive coupling through the second capacitor 950 raises the improved output signal 1100 to the second level 1120, continuing to yield advantageous results. Specifically, the second level 1120 of the improved output signal 1100 is about 5.1 volts, about 0.3 volts higher than the second level 1020 of the output signal 1000. This difference between the second level 1120 and the second level 1020 is of significant magnitude and duration.

Figure 11:
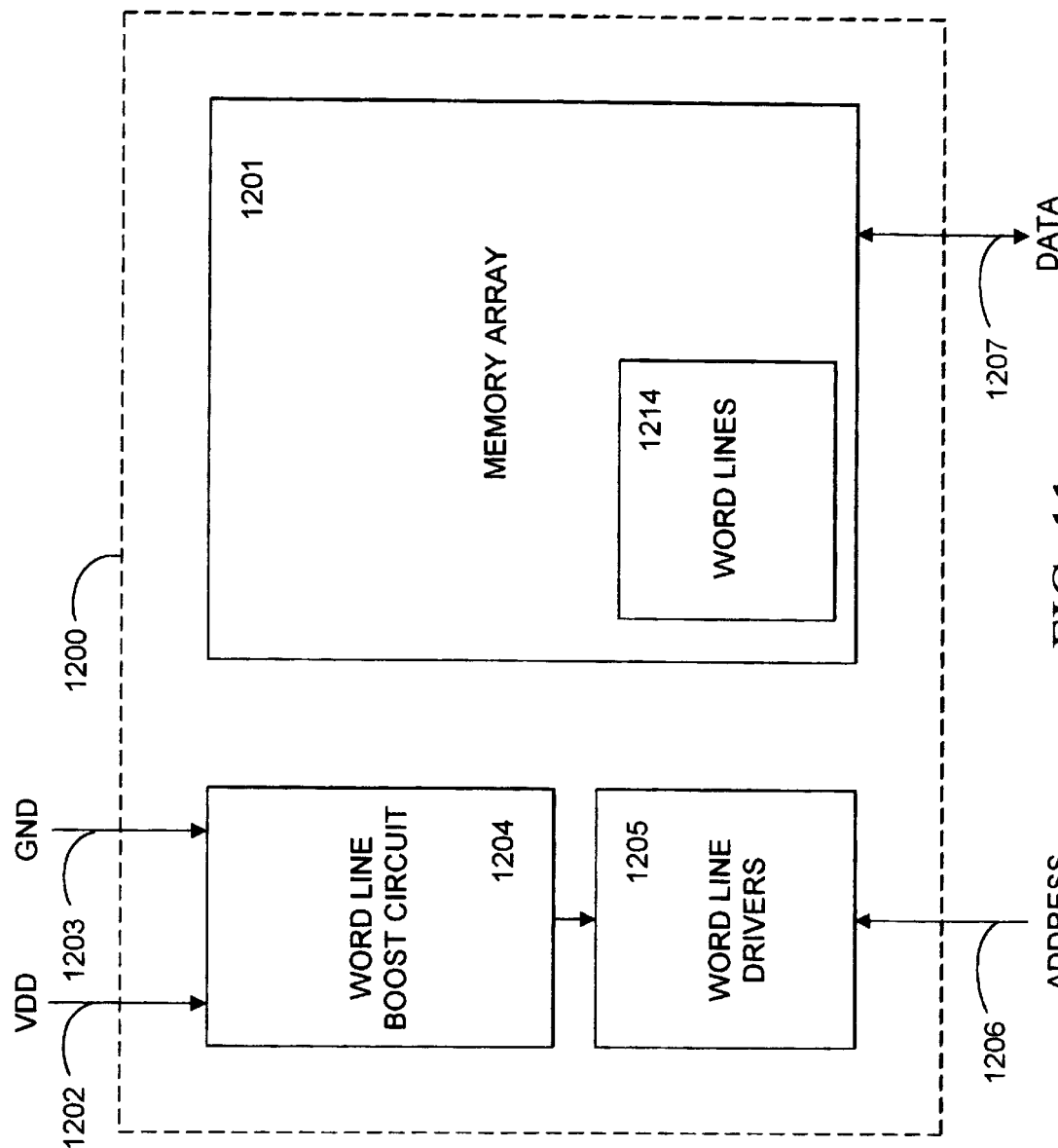
FIG. 11 is a simplified block diagram of an integrated circuit utilizing an improved word line boost circuit.

FIG. 11 provides a simplified diagram of an integrated circuit device utilizing the word line boost circuit of the present invention. The integrated circuit 1200 includes a semiconductor substrate. A memory array 1201 on the substrate has word lines 1214 for accessing rows of memory cells in the memory array 1201. The word lines 1214 utilize an operating voltage which is outside a pre-specified range of a supply potential normally applied to the integrated circuit 1200 at supply terminals 1202 and 1203, which are adapted to receive a supply potential VDD and ground. The word line boost circuit 1204 supplies the operating potential to the word lines 1214 through word line drivers 1205. Input signals applied to the integrated circuit 1200 in this example include address signals 1206 applied to the word line drivers 1205 and data signals 1207.

FIG. 11 is representative of a wide variety of integrated circuits which include on-chip circuitry that utilizes the operational voltage outside the pre-specified range of the supply potential. Memory devices such as flash memory devices are one class of integrated circuit devices according to the present invention.

Other embodiments of the invention can use different logic in one or more of the precharge branch, the first circuit, and the second circuit to process the signals triggering the onsets of the boosting operations. Another embodiment of the invention uses different signals triggering the onsets of the boosting operations, for example, signals going from high to low; one signal going from high to low and another signal going from low to high; and level triggering signals. Another embodiment of the invention is a word line boost circuit producing a boosted negative voltage.

The foregoing description of various embodiments of the invention have been presented for purposes of illustration and description. It is not intended to limit the invention to the precise forms disclosed. Many modifications and equivalent arrangements will be apparent.

What is claimed is:

1. A boost circuit, comprising:
   an output;
   a precharge circuit connected to the output;
   a first capacitor having a first terminal and a second terminal, and the first terminal connected to the output;
   a first circuit connected to the second terminal of the first capacitor, and the first circuit defines one of a first state, a second state, and a third state, wherein in the first state the second terminal of the first capacitor is coupled to a first voltage supply, and in the second state the second terminal of the first capacitor is coupled to a second voltage supply, and in the third state the second terminal of the first capacitor is floating;
   a diode having a first terminal coupled to the output, and a second terminal;
   a second capacitor, having a first terminal coupled to the second terminal of the diode and having a second terminal;
   a second circuit connected to said second terminal of the second capacitor,
   wherein a tie delay separates a first onset of a first boosting operation of the first circuit and a second onset of a second boosting operation of the second circuit.

2. The boost circuit of claim 1, wherein one of the first voltage supply and the second voltage supply is ground.

3. The boost circuit of claim 1, wherein the precharge circuit comprises:
   a switching circuit having at least a first switching terminal and a second switching terminal, and the first switching terminal coupled to the output, and the second switching-terminal coupled to one of the first voltage supply and the second voltage supply.

4. The boost circuit of claim 1, wherein the second terminal of the first capacitor switches among the first state, the second state, and the third state in response to at least one of a first signal and a second signal.

5. The boost circuit of claim 4, wherein the second terminal of the first capacitor switches to the first state in response to both the first signal and the second signal.

6. The boost circuit of claim 4, wherein the second terminal of the first capacitor switches to the second state in response to the first signal.

7. The boost circuit of claim 4, wherein the second terminal of the first capacitor switches to the third state in response to both the first signal and the second signal.

8. An integrated circuit device, comprising:
a substrate;
a boost circuit on the substrate, comprising:
   an output;
   a precharge circuit connected to said output;
   a first capacitor having a first terminal and a second terminal, and the first terminal connected to the output;
   a first circuit connected to the second terminal of the first capacitor, and the first circuit defines one of a first state, a second state, and a third state, when in the first state the second terminal of the first capacitor is coupled to a first voltage supply, and in the second state the second terminal of the first capacitor is coupled to a second voltage supply, and in the third state the second terminal of the first capacitor is floating;
   a diode having a first terminal coupled to the output, and a second terminal; a second capacitor, having a first terminal coupled to the second terminal of the diode and having a second terminal;
   a second circuit connected to said second terminal of the second capacitor,
   wherein a time delay separates a first onset of a first boosting operation of the first circuit and a second onset of a second boosting operation of the second circuit.

9. The integrated circuit device of claim 8, wherein one of the first voltage supply and the second voltage supply is ground.

10. The integrated circuit device of claim 8, wherein the precharge circuit comprises:
   a switching circuit having at least a first terminal and a second terminal, and the first terminal coupled to the output, and the second terminal coupled to one of the first voltage supply and the second voltage supply.

11. The integrated circuit device of claim 8, wherein the second terminal of the first capacitor switches among the first state, the second state, and the third state in response to at least one of a first signal and a second signal.

12. The integrated circuit device of claim 11, wherein the second terminal of the first capacitor switches to the first state in response to both a first signal and a second signal.

13. The integrated circuit device of claim 11, wherein the second terminal of the first capacitor switches to the second state in response to a first signal.

14. The integrated circuit device of claim 11, wherein the second terminal of the first capacitor switches to the third state in response to both the first signal and the second signal.

15. An integrated circuit device, comprising:
a substrate;
a memory array on the substrate, and the memory array having memory cells;
a plurality of word lines coupled to memory cells in the memory array;
a boost circuit on the substrate, and the boost circuit comprising:
   an output couplable to one or more of the plurality of word line drivers;
   a precharge circuit connected to said output;
   a first capacitor having a first terminal and a second terminal, and the first terminal connected to the output;
   a first circuit connected to the second terminal of the first capacitor, and the first circuit defines one of a first state, a second state, and a third state, wherein in the first state the second terminal of the first capacitor is coupled to a first voltage supply, and in the second state the second terminal of the first capacitor is coupled to a second voltage supply, and in the third state the second terminal of the first capacitor is floating;
   a diode having a first terminal coupled to the output, and a second terminal;
   a second capacitor, having a first terminal coupled to the second terminal of the diode and having a second terminal;
   a second circuit connected to said second terminal of the second capacitor,
   wherein a time delay separates a first onset of a first boosting operation of the first circuit and a second onset of a second boosting operation of the second circuit.

16. The integrated circuit device of claim 15, wherein one of the first voltage supply and the second voltage supply is ground.

17. The integrated circuit device of claim 15, wherein the precharge circuit comprises:
   a switching circuit having at least a first terminal and a second terminal, and the first terminal coupled to the output, and the second terminal coupled to one of the first voltage supply and the second voltage supply.

18. The integrated circuit device of claim 15, wherein the second terminal of the first capacitor switches among the first state, the second state, and the third state in response to at least one of a first signal and a second signal.

19. The integrated circuit device of claim 18, wherein the second terminal of the first capacitor switches to the first state in response to both a first signal and a second signal.

20. The integrated circuit device of claim 18, wherein the second terminal of the first capacitor switches to the second state in response to a first signal.

21. The integrated circuit device of claim 18, wherein the second terminal of the first capacitor switches to the third state in response to both the first signal and the second signal.

22. A method for reducing energy consumption of a boost circuit to achieve higher boosting efficiency, comprising:
   precharging an output to a precharge voltage; then
   changing the output to a first voltage with a first coupling circuit that is connected to said output; then
   floating a part of the first coupling circuit; and then
   changing the output to a second voltage with a second coupling circuit that is connected to said output via a device that isolates said floating part from lower voltages.

23. A method for reducing energy consumption of a word line boost circuit to achieve higher boosting efficiency, comprising:
   changing an output from a precharge voltage to a first voltage with a first circuit; then
   setting a node in the first circuit to a floating voltage; and then
   changing the output from the first voltage to a second voltage via a device that isolates said floating voltages from lower voltages with an energy expenditure that is lower than if the node were not floating.

24. A boost circuit, comprising:
   an output;
   a first precharge circuit connected to the output, and the first precharge circuit having a first mode and a second mode, and in the first mode the first precharge circuit coupling the output to one of a voltage source, current source, and a ground, and in the second mode the output having a first floating voltage;

a diode having a first terminal and a second terminal, and the second terminal of the diode connected to the output;

a second precharge circuit connected to the first terminal of the diode, and the second precharge circuit having a first mode and a second mode, and in the first mode the second precharge circuit coupling the first terminal of the diode to one of a voltage source, current source, and a ground, and in the second mode the first terminal of the diode having a second floating voltage;

a first capacitor having a first terminal and a second terminal, and the first terminal of the first capacitor connected to the first terminal of the diode;

a first boost circuit coupled to the second terminal of the first capacitor;

a second capacitor having a first terminal and a second terminal, and the first terminal of the second capacitor connected to the output; and a second boost circuit coupled to the second terminal of the second capacitor.

25. A method for operating a boost circuit, comprising:

precharging a first terminal of a diode which is connected to an output;

precharging a second terminal of the diode; then floating the first terminal of the diode;

floating the second terminal of the diode;

boosting the first terminal of the diode; and then boosting the second terminal of the diode.

* * * * *